(12) United States Patent
Mheich et al.

(10) Patent No.: US 11,456,820 B2
(45) Date of Patent: Sep. 27, 2022

(54) METHOD AND APPARATUS FOR WIRELESS COMMUNICATIONS WITH UNEQUAL ERROR PROTECTION

(71) Applicant: Huawei Technologies Co., Ltd., Shenzhen (CN)

(72) Inventors: Zeina Mheich, Guildford (GB); Lei Wen, Changsha (CN); Pei Xiao, Aldershot (GB); Amine Maaref, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 21 days.

(21) Appl. No.: 17/089,101

(22) Filed: Nov. 4, 2020

(65) Prior Publication Data

US 2021/0119734 A1    Apr. 22, 2021

Related U.S. Application Data

(63) Continuation of application No. PCT/CN2018/094693, filed on Jul. 5, 2018.

(51) Int. Cl.
*H04L 1/00* (2006.01)
*H03M 13/11* (2006.01)
(Continued)

(52) U.S. Cl.
CPC ....... *H04L 1/0061* (2013.01); *H03M 13/1102* (2013.01); *H03M 13/356* (2013.01);
(Continued)

(58) Field of Classification Search
CPC ... H04L 1/0061; H04L 1/0041; H04L 1/0071; H04L 27/36; H04L 1/00; H04L 1/0057;
(Continued)

(56) References Cited

U.S. PATENT DOCUMENTS 6,831,574 B1    12/2004    Mills et al.
10,110,346 B1 *    10/2018    Patel ................ H04L 25/03286
(Continued)

FOREIGN PATENT DOCUMENTS

| CN | 101385357 A | 3/2009 |
|---|---|---|
| CN | 101658006 A | 2/2010 |
| WO | 03107539 A1 | 12/2003 |

OTHER PUBLICATIONS

Chen et al. "Dual Diversity Space-Time Coding for Multimedia Broadcast/Multicast Service in MIMO Systems," in IEEE Transactions on Communications, vol. 60, No. 11, pp. 3286-3297, Nov. 2012. (Year: 2012).*

*Primary Examiner* — Cynthia Britt
(74) *Attorney, Agent, or Firm* — Slater Matsil, LLP

(57) ABSTRACT

In accordance with embodiments, methods for data communications are disclosed. A device obtains a forward error correction (FEC) encoded bit stream. The device maps the FEC encoded bit stream to produce a set of symbols according to a bit-to-symbol mapping rule. The bit-to-symbol mapping rule comprises a first mapper bit position associated with a first mapper error protection level and a second mapper bit position associated with a second mapper error protection level. The first mapper error protection level is greater than the second mapper error protection level. The device then transmits the set of symbols in the communications system.

19 Claims, 9 Drawing Sheets

(51) Int. Cl.
    *H03M 13/35*     (2006.01)
    *H04L 27/36*     (2006.01)

(52) U.S. Cl.
    CPC .......... *H04L 1/0041* (2013.01); *H04L 1/0071* (2013.01); *H04L 27/36* (2013.01)

(58) Field of Classification Search
    CPC ....... H04L 1/0058; H04L 1/007; H04L 27/26; H04L 27/3416; H03M 13/1102; H03M 13/356; H03M 13/27; H03M 13/255
    See application file for complete search history.

(56) References Cited

U.S. PATENT DOCUMENTS

| | | | |
|---|---|---|---|
| 2003/0039318 A1* | 2/2003 | Tong | H03M 13/2957 375/298 |
| 2007/0127587 A1 | 6/2007 | Ouyang et al. | |
| 2007/0204205 A1* | 8/2007 | Niu | H03M 13/356 714/780 |
| 2008/0239936 A1 | 10/2008 | Doberstein | |
| 2014/0270000 A1* | 9/2014 | Liu | H04L 1/0047 375/320 |
| 2016/0197752 A1* | 7/2016 | Schmalen | H04L 5/0048 375/298 |
| 2018/0083716 A1* | 3/2018 | Cho | H04L 27/3411 |
| 2019/0007092 A1* | 1/2019 | Bayesteh | H04L 1/00 |

\* cited by examiner

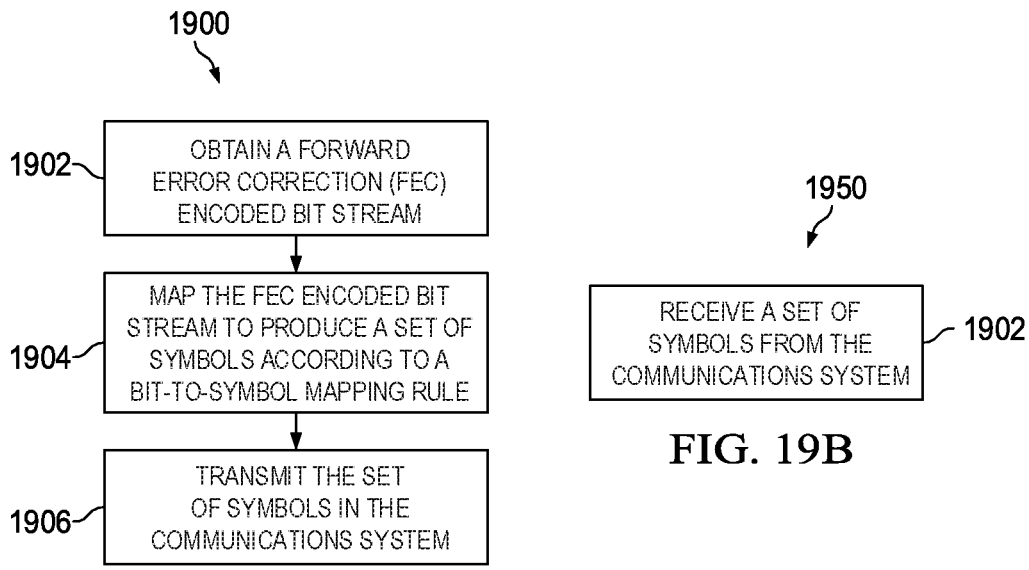
FIG. 19A
FIG. 19B
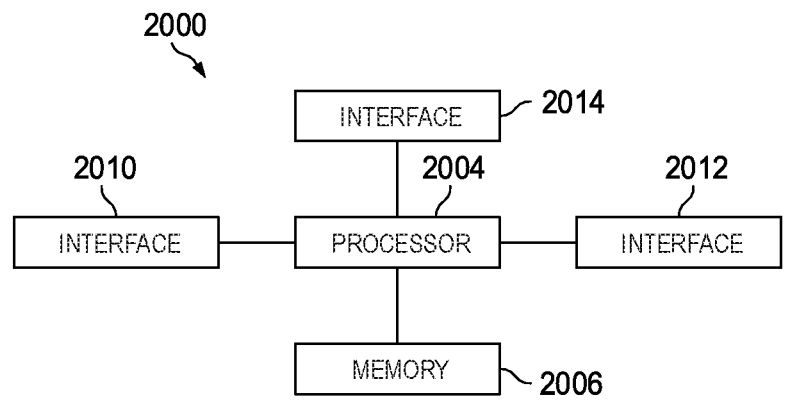
FIG. 20
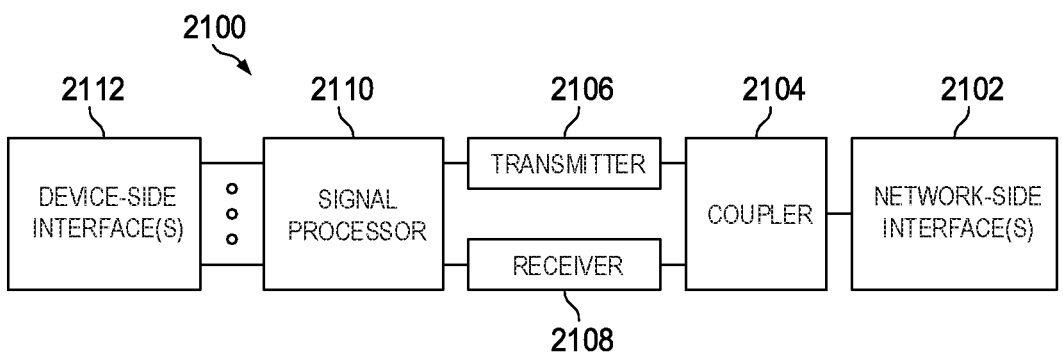
FIG. 21

METHOD AND APPARATUS FOR WIRELESS COMMUNICATIONS WITH UNEQUAL ERROR PROTECTION

CROSS-REFERENCE TO RELATED APPLICATIONS

This application is a continuation of International Patent Application No. PCT/CN2018/094693, filed on Jul. 5, 2018, entitled "Method and Apparatus for Wireless Communications with Unequal Error Protection," which application is hereby incorporated by reference in its entirety.

TECHNICAL FIELD

The present disclosure relates generally to wireless communications and, in some particular embodiments, to methods and systems for multiple access (MA) communications.

BACKGROUND

Multiple access (MA) is a function of wireless communications systems in which multiple user equipments can share resources. Multiple access systems may be orthogonal or non-orthogonal. In orthogonal multiple access systems, such as time division multiple access (TDMA), frequency division multiple access (FDMA), and orthogonal frequency division multiple access (OFDMA), signals for different users are transmitted on different physical channel resources (e.g., time, frequency, or some combination). In non-orthogonal multiple access (NoMA) systems, such as code division multiple access (CDMA), interleave division multiple access (IDMA), interleave grid multiple access (IGMA), multi-user shared access (MUSA), low density signature (LDS), and sparse code multiple access (SCMA), there may be cross-correlation of signals for different user equipments. Intentionally introducing non-orthogonality will typically improve spectrum efficiency of the multiple access communications system; however, the non-orthogonality may also create challenges in terms of transmitter and receiver implementation. One such challenge is optimization for codebooks or constellations. Codebook or constellation implementations seek to increase the coding gain or to lower the complexity of the multi-user detector. However, conventional codebook or constellation implementations do not consider the existing error-correction code. It is desirable to improve the implementations of codebooks or constellations that take into account the unequal error protection (UEP) property of the error correction code.

SUMMARY

Technical advantages are generally achieved, by embodiments of this disclosure which describe methods and systems for multiple access communications.

In accordance with embodiments, methods for data communications are disclosed. A device obtains a forward error correction (FEC) encoded bit stream. The device maps the FEC encoded bit stream to produce a set of symbols according to a bit-to-symbol mapping rule. The bit-to-symbol mapping rule comprises a first mapper bit position associated with a first mapper error protection level and a second mapper bit position associated with a second mapper error protection level. The first mapper error protection level is greater than the second mapper error protection level. The device then transmits the set of symbols in the communications system.

Apparatuses, devices, as well as non-transitory computer-readable mediums and computer program products, for performing the methods are also provided.

BRIEF DESCRIPTION OF THE DRAWINGS

For a more complete understanding of the present invention, and the advantages thereof, reference is now made to the following description taken in conjunction with the accompanying drawings, in which:

FIG. 19A illustrates a flowchart of method for data communications by a transmitting device in a communications system, according to some embodiments;

FIG. 19B illustrates a flowchart of method for data communications by a receiving device in a communications system, according to some embodiments;

FIG. 20 is a block diagram of an embodiment processing system for performing methods described herein; and FIG. 21 is a block diagram of a transceiver adapted to transmit and receive signaling over a telecommunications network according to example embodiments described herein.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
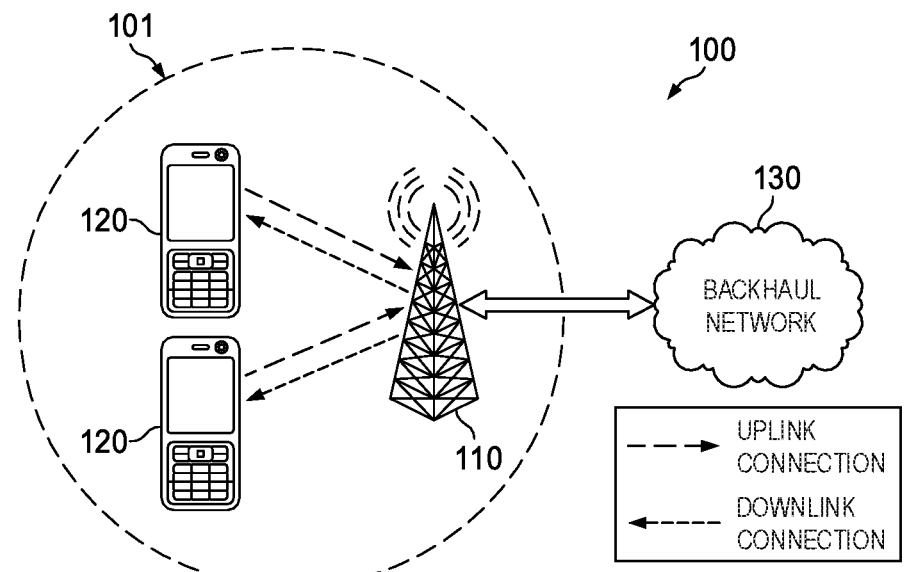
FIG. 1 is a diagram of an embodiment wireless communications network.

The making and using of embodiments of this disclosure are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. These and other inventive aspects are described in greater detail below.

The operating of the current example embodiments and the structure thereof are discussed in detail below. It should be appreciated, however, that the present disclosure provides many applicable inventive concepts that can be embodied in a wide variety of specific contexts. The specific embodiments discussed are merely illustrative of specific structures of the embodiments and ways to operate the embodiments disclosed herein, and do not limit the scope of the disclosure. For example, while aspects of the present disclosure are particularly advantageous for multiple access communications, some embodiments may also be useful and applicable to wireless communications in general. Advantages of the present disclosure may be realized in a wireless communication system regardless of whether or not the system is configured for multiple access. Additional benefits may be gained in embodiments relating to non-orthogonal multiple access (NoMA).

NoMA improves the spectral efficiency of wireless radio access by enabling overloading (i.e., the number of multiplexed users can be larger than the number of resources). Main categories of NoMA techniques are code domain NoMA (e.g., SCMA and LDS) and power domain NoMA (PD-NoMA).

Power domain NoMA schemes achieve multiple access by allocating different power levels to different users. The receiver may use successive interference cancellation to perform multi-user detection.

Code domain NoMA schemes employ the concept of a multiple access code or signature that is specific to a user or a data stream. The multiple access code or signature modifies the transmitted data such that the transmitted data can be discriminated at a decoder. LDS is a code-domain NoMA technique where bits are mapped to a complex symbol according to a one-dimensional constellation, and the complex symbol is expanded to a sequence of complex symbols by using a specific spreading signature.

SCMA is also a code-domain NoMA technique and may be considered a generalization of LDS. In some variants of SCMA, the bit-to-symbol mapping and code/signature-specific spreading are combined together such that bits are directly mapped to multi-dimensional sparse codewords selected from user-specific SCMA codebooks. A "codebook" is a set of user-specific codes/signatures combined with a bit-to-symbol(s) mapping rule for directly mapping bits to multi-dimensional sparse codewords. The increased design flexibility afforded by varying both the code/signature and the modulation mapping may provide greater multiple access performance. By using multi-dimensional codebooks, SCMA can benefit from shaping gains of multi-dimensional constellations. In some other variants of SCMA, the mapping and the spreading may be separated.

NoMA communications systems based on more optimal codebooks or constellations could increase coding gain or lowered complexity of multiuser detection, for example. The design of optimal NoMA codebooks or constellations is still a challenging problem. Although some simple methods for designing sub-optimal codebooks or constellations have been proposed for SCMA, for example, it is desirable to implement NoMA communications systems based on more optimal codebooks or constellations.

FIG. 1 is a diagram of a network 100 for communicating data. The network 100 comprises a base station 110 having a coverage area 101, a plurality of user equipments (UEs) 120, and a backhaul network 130. As shown, the base station 110 establishes uplink (dashed line) and/or downlink (dotted line) connections with the UEs 120, which serve to carry data from the UEs 120 to the base station 110 and vice-versa. Data carried over the uplink/downlink connections may include data communicated between the UEs 120, as well as data communicated to/from a remote-end (not shown) by way of the backhaul network 130. As used herein, the term "base station" refers to any component (or collection of components) configured to provide wireless access to a network, such as a "Node B," an enhanced Node B (eNB), a next generation Node B (gNB), a transmit/receive point (TRP), a macro-cell, a femtocell, a Wi-Fi access point (AP), and other wirelessly enabled devices. Base stations may provide wireless access in accordance with one or more wireless communications protocols, e.g., 5th generation "New Radio" (NR), Long Term Evolution (LTE), LTE Advanced (LTE-A), High Speed Packet Access (HSPA), Wi-Fi 802.11a/b/g/n/ac, etc. As used herein, the term "UE" refers to any component (or collection of components) capable of establishing a wireless connection with a base station, such as a mobile device, a mobile station (STA), and other wirelessly enabled devices. In some embodiments, the network 100 may comprise various other wireless devices, such as relays, low power nodes, etc.

Figure 2:
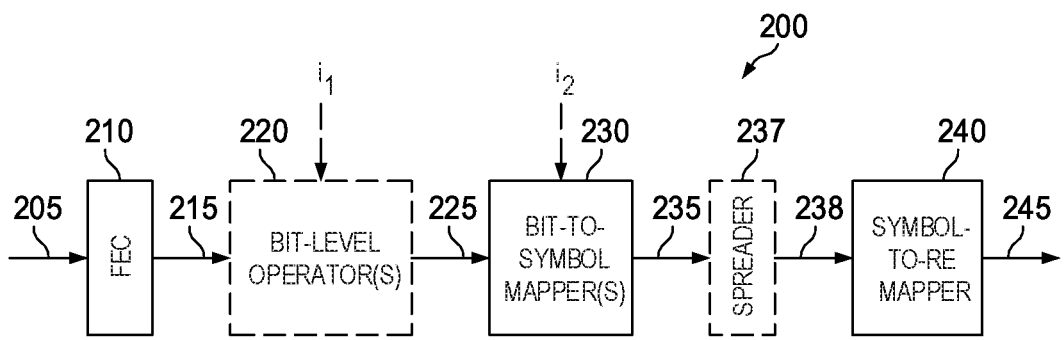
FIG. 2 is a diagram of an embodiment transmitter for transmitting a signal in the wireless communications network.

FIG. 2 is a diagram of an embodiment transmitter 200 for generating a multiple access signal 245 from input data 205. Input data 205 may be payload data encoded in a binary form. The payload may be "user" data that is destined for a UE 120, in a downlink transmission for example, or that is transmitted from the UE 120 to a base station 110, in an uplink transmission for example. Input data 205 may also be data directly communicated between two UEs 120 in a sidelink transmission. Input data 205 may be received at a forward error correction encoder 210.

The FEC encoder 210 may be any encoder configured to produce an error-detection/correction encoded bit stream, including (but not limited to) a Turbo encoder, a low-density parity-check (LDPC) encoder, and/or a polar encoder. An error detection/correction encoded bit stream may be a bit-stream that includes error correction bits (e.g., parity bits, FEC bits, etc.) and/or error detection bits (e.g., cyclic redundancy check (CRC) bits, etc.). The FEC encoder 210 may apply error detection/correction encoding to an input data that was not previously encoded with error detection/correction. Alternatively, the FEC encoder 210 may apply error detection/correction encoding to an input data that already has some form of error detection/correction that is typically provided by an upper-layer function of whichever system implements the transmitter 200. The FEC encoder 210 generates a first bit-stream 215 and optionally forwards the first bit-stream 215 to one or more bit-level operators 220. Alternatively, the input data 205 is the first bit-stream 215, and is received directly at the bit-level operator(s) 220.

The bit-level operator 220 may be, for example, circuitry or software configured to execute a combination of bit-level operations (e.g., Boolean functions) in order to accomplish various functions such as bit interleaving, bit scrambling, full or partial bit-stream repetition, etc. Optionally, the function may be defined by one or more input parameters. Thus, the bit-level operator 220 may further receive one or more control signals $i_1$ for adjusting the one or more parameters of the bit-level operator 220. The bit-level operator 220 generates a second bit-stream 225 and forwards the second bit-stream to one or more bit-to-symbol mapper(s) 230. Alternatively, the second bit-stream 225 may be the same as the input data or the first bit stream, in which case the bit-to-symbol mapper(s) 230 may directly receive the input data or the first bit stream. The bit-to-symbol mapper 230 may also be known as a modulator.

The bit-to-symbol mapper 230 generates one or more symbols 235 from the second bit-stream 225. Typically, a symbol can be represented by one of many different complex-valued numbers, which each in turn represents a different binary sequence. In this way, the mapper function encodes one or more bits into a symbol. In other words, the bit-to-symbol mapper 230 includes a one-to-one mapping of unique bit sequences to unique symbols.

Examples of common bit-to-symbol mappers include Quadrature Amplitude Modulation (QAM), Binary Phase Shift Keying (BPSK), $$\frac{\pi}{2} - BPSK$$

modulation, and Quadrature Phase Shift Keying (QPSK). QAM may be further sub-categorized by the "level" of modulation, i.e., by the length of the input bit sequence and the resulting number of possible different output symbols, such as 16-QAM, 64-QAM, and 256-QAM, for example. Additionally, QPSK may also be known as 4-QAM. The bit sequence-to-symbol mapping of a given mapper may be visually represented by a constellation diagram.

The bit-to-symbol mapper 230 may map the second bit-stream 225 to produce one or more symbols 235 according to a bit-to-symbol mapping rule. The bit-to-symbol mapping rule may comprise a first mapper bit position associated with a first mapper error protection level and a second mapper bit position associated with a second mapper error protection level. The first mapper error protection level may be greater than the second mapper error protection level. Details of the bit-to-symbol mapper 230 will be described in later sections of this disclosure below.

The transmitter 200 may also additionally, or alternatively, implement more complex mapping schemes, such as multi-dimensional mapping. Moreover, the transmitter 200 may implement multiple bit-to-symbol mappers 230, for example, to map parallel bit-streams, such as duplicate bit-streams or interleaved bit-streams. Optionally, the mapping function may be defined by one or more input parameters. The bit-to-symbol mapper 230 may further receive one or more control signals $i_2$ for adjusting the one or more parameters of the bit-to-symbol mapper 230.

The transmitter 200 may optionally comprise a spreader 237 that expands symbols 235 to a sequence of symbols 238 by using a specific spreading signature. FIG. 2 depicts the spreader 237 as a separate component from the bit-to-symbol mapper 230 in some embodiments. In other embodiments, the bit-to-symbol mapping and code/signature-specific spreading are combined together such that bits are directly mapped by the bit-to-symbol mapper 230 to generate the sequence of symbols 238.

The transmitter 200 further comprises a symbol-to-resource element (RE) mapper 240, which receives the sequence of symbols 238 from the spreader. The symbol-to-RE mapper 240 maps the sequence of symbols to a corresponding set of REs according to a given multiple access mapping rule, which results in the multiple access signal 245. The multiple access signal 245 is then transmitted to a receiver. Optionally, the multiple access mapping rule may be defined by one or more input parameters.

Figures 3, 4:
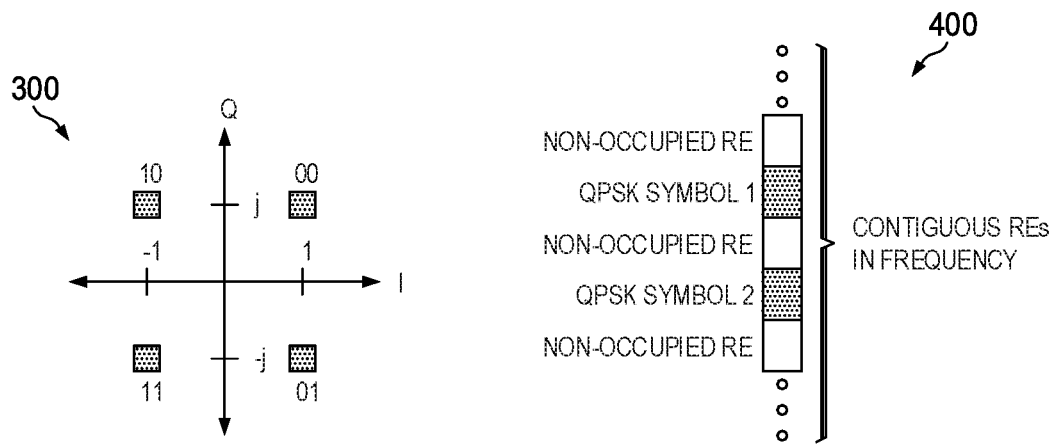
FIG. 3 is a constellation diagram of an example QPSK modulator.
FIG. 4 is a schematic diagram of an example symbol-to-RE mapping operation.

FIG. 3 is a constellation diagram 300 of a QPSK (or 4-QAM) modulator. The x-axis (real values) represents an in-phase component of a signal while the y-axis (imaginary values) represents a quadrature component of the signal. The constellation diagram shows four different symbols, at (1, j), (−1, j), (−1, −j), and (1, −j). Each of the four symbols is mapped to respective inputs bit sequences (00), (10), (11), and (01). The distance of the symbol point from the origin of the constellation represents the amplitude of the signal waveform; the angle of the symbol point relative a reference represents a phase difference of the signal waveform. Thus, the QPSK-modulated signal comprises symbols with the same amplitude and different phase changes. Other modulation schemes may comprise different symbol points on the constellation, resulting in different amplitudes and phase changes.

FIG. 4 is a schematic diagram showing an example operation 400, by the symbol-to-RE mapper 240, of mapping two QPSK symbols to specific REs. While FIG. 4 shows RE mapping in the frequency domain, the symbol-to-RE mapper 240 may also map the symbols to different REs in the time domain, as well as the frequency domain.

Conventional implementations of codebooks or constellations assume the environment in an uncoded system. Conventional methods do not take into account implementations of an error-correction code in the codebook design. In a real-world communications system, an error-correction code is often used and may introduce unequal protections between coded bits (i.e., some bits are more protected than others). For example, a coded bit mapped to a high-degree variable node in LDPC codes is more protected than a coded-bit mapped to a low-degree variable node. Codebook design methods proposed for conventional NoMA systems do not take into account the possible unequal error protection property of the error-correction code.

It is an objective of this disclosure to provide a communications system based on implementations of codebooks or constellations that take into account unequal error protections. The communication system may be a system for multiple access communications. Some embodiments of this disclosure also apply to wireless communications in general, regardless of whether or not the system is configured for multiple access. The protection levels of a codebook or a constellation may be more optimized based on the existing error correction code in order to increase the coding gain.

This disclosure describes the use of partitioning, or "cloud" partitioning, of codewords to create codebooks (for SCMA) or constellation (e.g., for LDS, PD-NoMA, orthogonal multiple access (OMA), or conventional non-MA) with different protection levels. The described techniques optimize the power allocated to the bits constituting the binary label vector of the SCMA codeword, and belonging to the same protection level, based on the characteristics of the existing error-correction code, and more specifically, based on the UEP property of the error-correction code. In one embodiment, more power is allocated to bits with a higher protection level in order to improve the performance of the iterative decoding.

In one example implementation of codebooks in the case of SCMA and constellations in the case of LDS, PD-NOMA, OMA, or conventional non-MA C represents an SCMA codebook ($c_i$, i=1, . . . , M are codewords) or a constellation in LDS, PD-NOMA, OMA, or conventional non-MA ($c_i$, i=1, . . . , M are constellation points). C may be of the size $M=2^m$, with L≤m protection levels. One embodiment implementation method assigns a binary label vector ($b_0^i$, $b_1^i$, . . . , $b_{m-1}^i$), $b_j^i \in \{0, 1\}$ to each codeword or constellation point $c_i$, i=1, . . . , M. The use of the binary label vector is for the ease of explanation. The disclosed implementation methods are not constrained to the use of a specific labeling method of the constellation points or codewords. The implementation methods are based on partitioning of codewords or constellation points into subsets (i.e., clouds) of codewords or constellation points. Steps for implementing a method according to aspects of the present disclosure are provided below.

The method assigns one protection level $\ell \in \mathcal{L}=\{1, \ldots, L\}$ to each bit $b \in \{b_0, b_1, \ldots, b_{m-1}\}$ of the binary label vector of the codebook or constellation. Here, $\mathcal{B}_\ell$ denotes the set of the bits with the same protection level $\ell$. It may be assumed that $\mathcal{B}_\ell \neq \emptyset$ and $\mathcal{B}_i \cap \mathcal{B}_j = \{(\emptyset)\}$, $\forall i, j, \ell \in \mathcal{L}$.

Let $M_\ell = 2^{|\mathcal{B}_\ell|}$. Here, |•| is the cardinality. For each level $\ell$, the method generates $M_\ell$ subsets, $\mathcal{C}1_i$, i=1 . . . $M_\ell$, such that the minimum distance between two subsets in the same protection level is equal to $d_{min}^\ell$. Each subset (i.e., cloud) $\mathcal{C}1_i$ has a binary label vector $s_i^\ell$, which represents a special realization of the set $\mathcal{B}_\ell$, For example, if $\mathcal{B}_1 = \{b_i, b_j\}$, the method may generate 4 subsets for level 1. The 4 subsets (i.e., clouds) $\mathcal{C}1_i$, i=1 . . . 4 may be labeled $s_1^1=\{00\}$, $s_2^1=\{01\}$, $s_3^1=\{10\}$, $s_4^1=\{11\}$, respectively. Each codeword or constellation point in C with $\mathcal{B}_\ell = \{b_i, b_j\} = s_k^\ell$ belongs to the kth subset $\mathcal{C}1_k$ of level $\ell$.

Without loss of generality, according to some embodiments, it may be assumed that the protection levels decreases from 1 to L (i.e., the bits in $\mathcal{B}_\ell$ are more protected than those in $\mathcal{B}_{\ell+1}$). Thus, the subsets are generated such that $d_{min}^\ell > d_{min}^{\ell+1} \forall \ell \in \mathcal{L}$, which leads to unequal error protections between subsets that do not belong to the same level. Moreover, for each level $\ell$, the minimum distance between the codewords or constellation points in the same subset (i.e., cloud) should be less than $d_{min}^\ell$, which leads to unequal error protections between the codewords or constellation points that do not belong to the same subset. Under these constraints, $d_{min}^\ell$ is optimized to improve the system performance. Specifically, in one embodiment, the method optimizes $d_{min}^\ell$ based on the existing error correction code.

Figure 5:
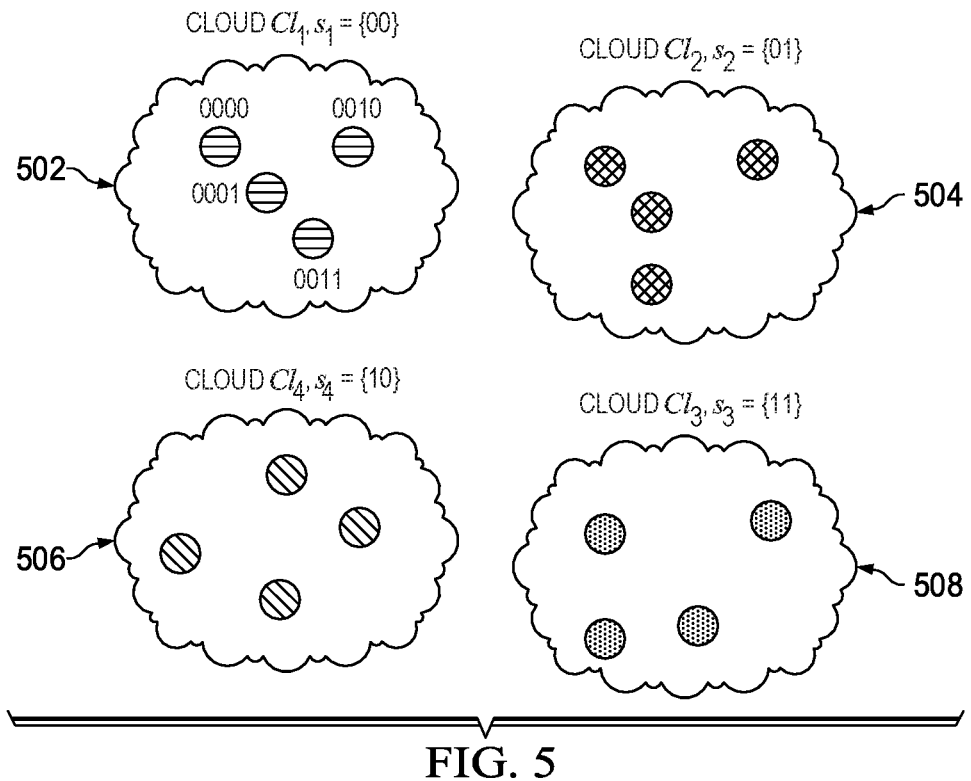
FIG. 5 illustrates an example UEP codebook or constellation with two protection levels and sixteen codewords.

FIG. 5 shows a codebook (or constellation) of M=16 codewords (or constellation points) with two protection levels, according to some example embodiments. The four clouds 502, 504, 506, and 508 are those of the first protection level, $\ell$ =1. The filled circles in clouds 502, 504, 506, and 508 represent codewords. The codewords belonging to a cloud $\mathcal{C}1_i$ have a binary label vector starting with $s_i$. For example, codewords in cloud 402 have a labeling (0, 0, $b_2$, $b_3$) (i.e., $b_0=0$, $b_i=0$). The codewords belonging to different clouds are more distant from each other than codewords inside the same cloud, which leads to more protection for the bits $b_0$, $b_1$ assigned to the clouds than bits $b_2$, $b_3$ assigned to the codewords inside a cloud.

In one embodiment, an implementation of the cloud partitioning method builds a codebook or constellation with L protection levels by superposing L codebooks or constellations with different average powers. For one-dimensional codebooks, this is equivalent to superposing two constellations with different average powers. For example, the superposition of two QPSK constellations, with average powers $P_1$ and $P_2$ respectively, produces a 16-QAM with two protection levels. The level of protection may be adjusted by the ratio $P_1/P_2$.

Figure 6:
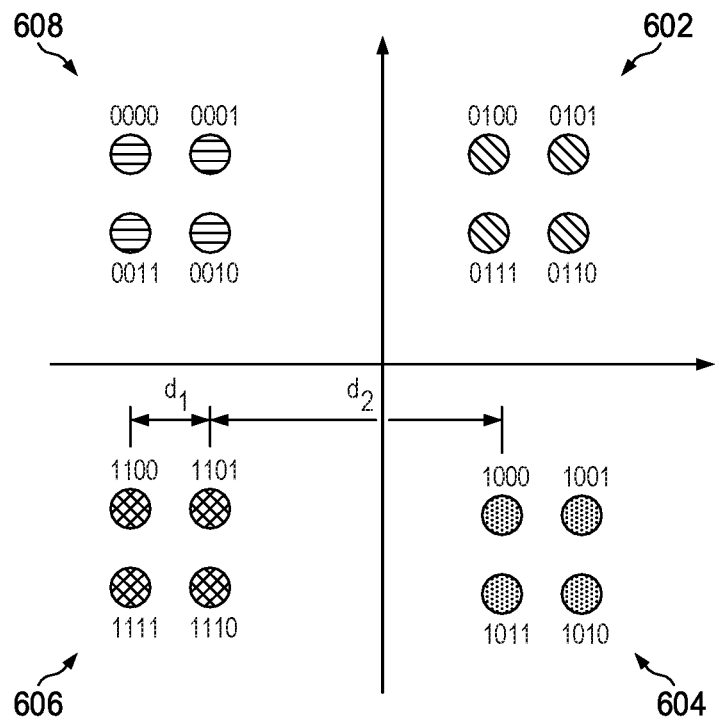
FIG. 6 illustrates an example one-dimensional UEP codebook (i.e., constellation) which provides UEP symbols.

One example of a one-dimensional UEP codebook (i.e., constellation) is shown in FIG. 6. The one-dimensional UEP codebook (i.e., constellation) comprises 16 constellation points in four quadrants, 602, 604, 606, and 608. Each constellation point represents a bit-to-symbol mapping. The distance ($d_1$) between two constellation points in the same quadrant (e.g., quadrant 608) is smaller than the distance between two constellation points across two different quadrants (e.g., quadrants 606 and 608). Thus, the 4 constellation points located in the same quadrant form a cloud. The first two bits of the label of each constellation point are more robust against noise (i.e., more protected) than last two bits of the constellation point. The constellation may be obtained by superposing two QPSK constellations with different average powers.

In a first embodiment, the implementation method applies the above cloud partitioning method to construct UEP SCMA codebooks. This embodiment is more efficient for downlink transmissions (for uplink transmissions, other methods based on cloud partitioning may be implemented). This method is not the only method that could be used to construct UEP SCMA codebooks based on cloud partitioning. Other SCMA codebook implementation methods may be extended to create UEP SCMA codebooks after adding the cloud partitioning step into the implementation method.

In the first embodiment, M, N, K, V represent the codebook size for each user, the codebook dimension, the number of resources shared by users, and the number of users, respectively. The implementation method constructs a mother constellation of dimension N with M points for each user u. The users do not necessarily have to have the same mother constellation. For each user u, the following steps are performed:

At each protection level $\ell$, define the row vector $S^\ell = [s_1, s_2, \ldots, s_{M_\ell}]$, where $s_m = (2m-1-M_\ell) \cdot (1+i)$, m=1, . . . , $M_l$ and i=$\sqrt{-1}$. Here, $S^\ell$ represents a one-dimensional lattice of equally spaced complex symbols.

For each level $\ell$, define the "amplitude" row vector, $A_u^\ell = [a_1^{\ell,u}, \ldots, a_N^{\ell,u}]$. Since it may be assumed that level $\ell$ is more protected than level j if $\ell$ <j, $a_n^{\ell,u} > a_n^{j,u}$ for each dimension n∈ {1, . . . , N}. $A_u^\ell$ is a new parameter added. The codebooks in conventional methods are a particular case of UEP codebooks when the values of $A_u^\ell$ are fixed and not optimized based on the existing error correction code.

For each n∈ {1, . . . , N}, construct the one-dimensional lattice $R_n^u$ of M complex symbols by superposing L constellations $a_n^{1,u} S^1 \boxplus \ldots \boxplus a_n^{L,u} S^L$, where $\boxplus$ stands for constellation superposition.

Build a matrix $\Omega^u$ of size N×M. The $n^{th}$ row of $\Omega^u$ is given by $R_n^u \cdot e^{i\theta_n}$, where $$\theta_n = (n-1)\frac{\pi}{MN}, n = 1, \ldots, N.$$

Construct the mother constellation $M_c^u$ for user u, by interleaving the elements of some rows of $\Omega^u$ in order to reduce the peak-to-average power ratio (PAPR). For example, a conventional interleaver may be for the rows of even indices. The same interleaver may be used to design UEP codebooks, but not to interleave two clouds at level $\ell+1$ belonging to different clouds of level $\ell$. Hence, at level 1, clouds between them and for $\ell>1$ may be interleaved. Only clouds belonging to the same mother cloud may be interleaved at level $\ell+1$.

Apply a rotation for each dimension of $M_c^u$ depending on the user index, in order to increase the diversity between user codebooks. One embodiment method may construct the final codebook for each user from its mother codebook. F denotes the SCMA factor graph matrix of the size K×V. Let $f_{ku}$ denote the element of F located at the kth row and uth column. $f_{ku}=1$ if user u is using resource k; otherwise, it is equal to 0. Here, $d_r$ denotes the number of users colliding over the same resource and $$\varphi_r = (r-1)\frac{2\pi}{Md_r} + \frac{2\pi}{M}e_r$$

for r=1, . . . , $d_r$, where $e_r$ is an arbitrary member of $\mathbb{Z}$. The embodiment may build a Latin matrix L, by replacing the non-zero elements of F by $e^{i\varphi_r}$, where the $\varphi_r$ are chosen such that L is Latin. For each user u, $\Delta_u=\text{diag}(L_u)$, where $L_u$ is the $u^{th}$ column of L without zero elements, and $V_u$ the mapping matrix of size K×N. Then, the codebook of user u is given by $C_u = V_u \cdot \Delta_u \cdot M_c^u$.

Figure 7:
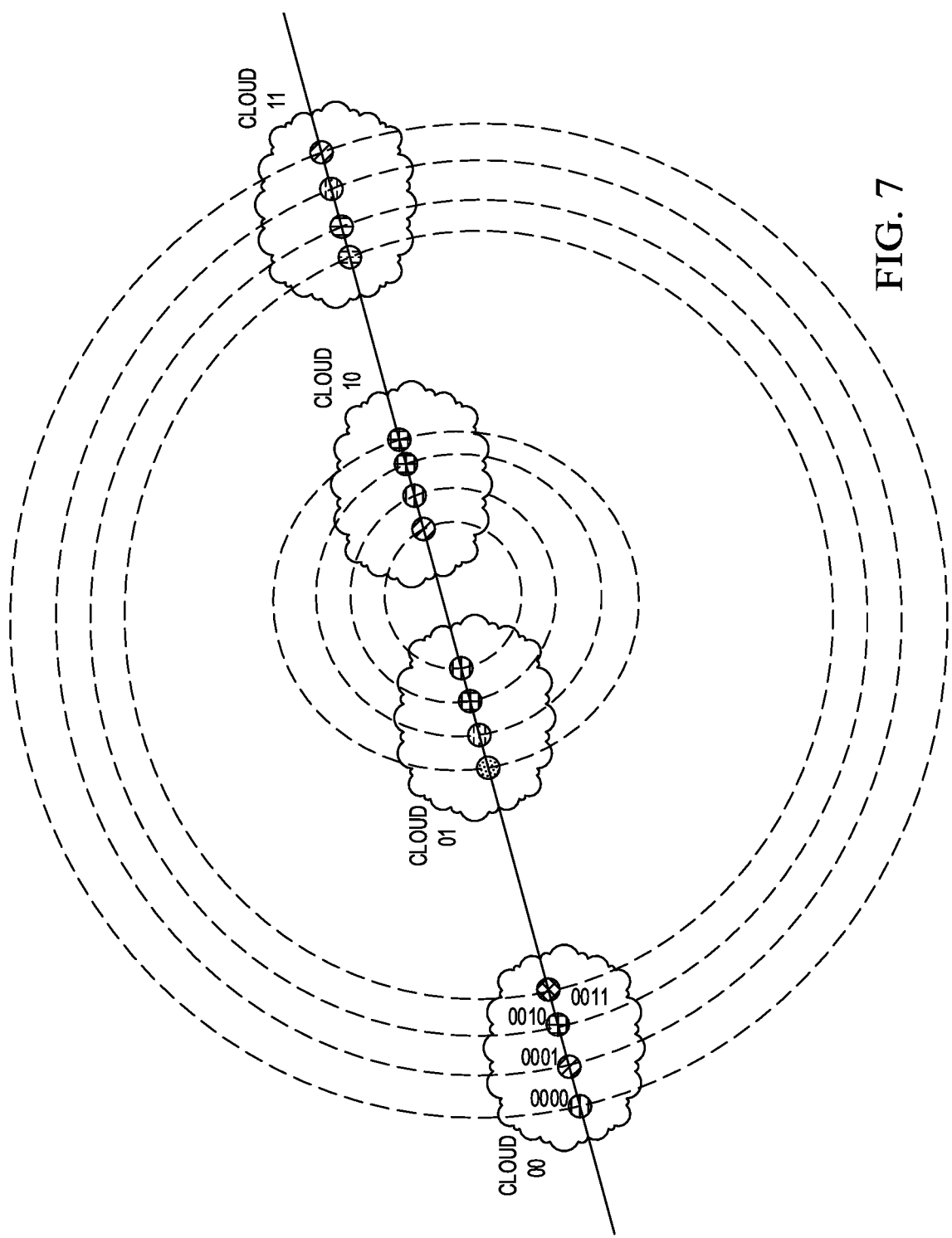
FIG. 7 illustrates example partitioning for one codebook dimension with two protection levels.

FIG. 7 illustrates the cloud-based partitioning for points constituting elements of one codebook dimension, with two protection levels. The codebook has 16 points, and each protection level is assigned 2 bits. The points constituting the elements of this dimension are obtained by superposing two one-dimensional lattices of four equally spaced symbols, having different average powers.

An example of a 16-point SCMA codebook C with two protection levels constructed using the above implementation method is shown below:
Re(C)=

Here, columns $c_1$-$c_4$, $c_5$-$c_8$, $c_9$-$c_{12}$, and $c_{13}$-$c_{16}$ form four different groups, respectively. The Euclidian distance between two codewords of the same group is less than the Euclidian distance between two codewords of different groups. Thus, codewords of the same group form a cloud. Since the two first bits $b_0$, $b_1$ of the label vector are used to distinguish among the clouds, the two first bits $b_0$, $b_1$ are more protected than bits $b_2$, $b_3$ that permit to distinguish between codewords of the same cloud. In other terms, the embodiment allocates more power for bits $b_0$, $b_1$, which make bits $b_0$, $b_1$ more robust against noise than bits $b_2$, $b_3$.

Figure 8:
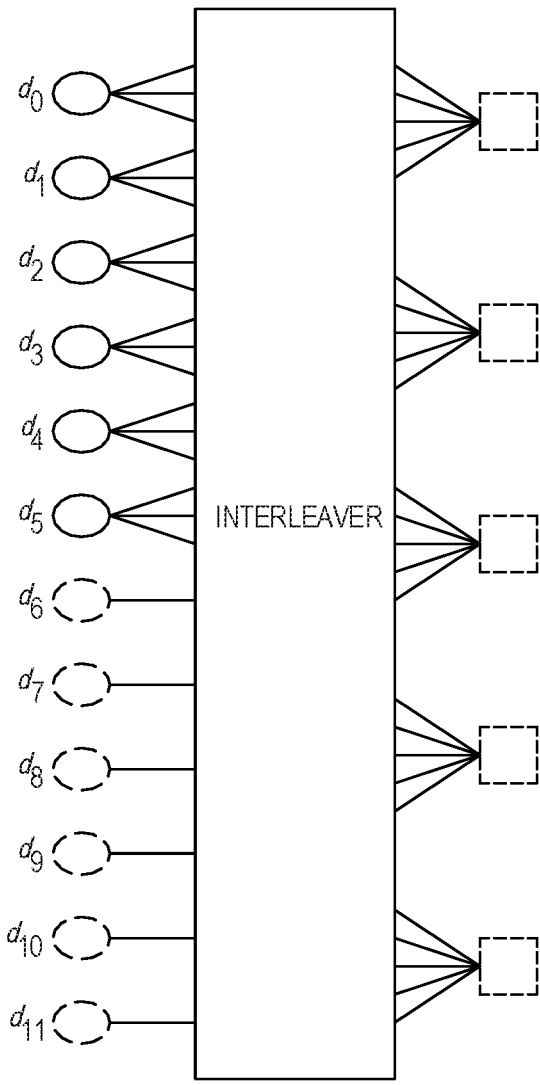
FIG. 8 shows an example LDPC code with variable nodes of the degrees of three and one.

FIG. 8 shows an example LDPC code with variable nodes of degrees 3 and 1. For example, bit $d_0$ is mapped to a variable node of a degree of 3 while bit $d_6$ is mapped to a variable node of a degree of 1. During iterative LDPC decoding, variable nodes of higher degrees converge faster than variable nodes of lower degrees. Moreover, since variable nodes of higher degrees are well connected to the LDPC graph, their messages dominate in the LDPC graph. Thus, if variable nodes of higher degrees are assigned to bits $b_0$, $b_1$ of the above UEP SCMA codebook, the messages of these variable nodes would be more and more reliable. This assignment may be achieved with or without using an interleaver between the LDPC encoder and the mapper.

Figure 9:
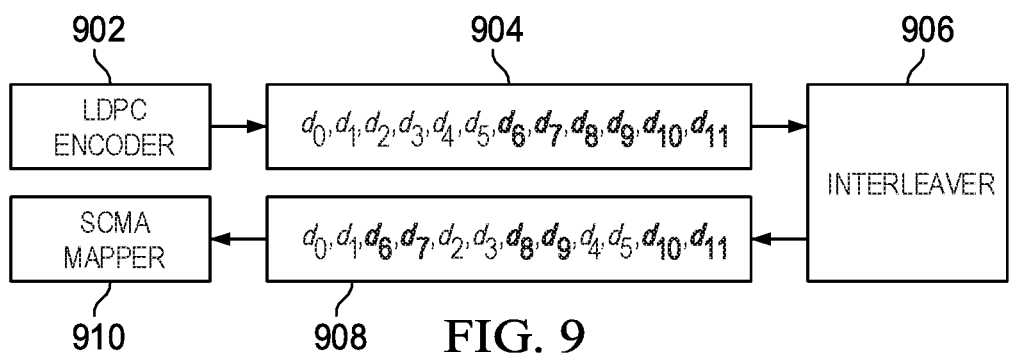
FIG. 9 illustrates an embodiment interleaver between a LDPC encoder and an SCMA mapper, according to one embodiment.

FIG. 9 illustrates an embodiment interleaver between a LDPC encoder and an SCMA mapper. Before interleaving, the LDPC encoder 902 outputs the coded bits 904. Coded bits 902 are sorted from higher degree to lower degree (e.g., $d_0$, $d_1$, $d_2$, $d_3$, $d_4$, $d_5$ have a degree of 3 while $d_6$, $d_7$, $d_8$, $d_9$, $d_{10}$, $d_{11}$ have a degree of 1). The interleaver 906 interleaves coded bits 904 and outputs bits 908. In bits 908, each four consecutive bits w, x, y, z are arranged such that w, x have a degree of 3 and y, z have a degree of 1. For example, $d_0$, $d_1$, $d_6$, $d_7$ may be the first four bits outputted by the interleaver 906. Then, the SCMA mapper 910 maps $d_0$, $d_1$, $d_6$, $d_7$ to a SCMA codeword (i.e., $(b_0, b_1, b_2, b_3)=(d_0, d_1, d_6, d_7)$). The output of the SCMA mapper 910 may be a codeword occupying 4 resources. For example, if $(d_0, d_1, d_6, d_7)=(0, 0, 0, 0)$, the output of the SCMA mapper will be (0, $$\text{Re}(C) = \begin{bmatrix} 0 & 0 & 0 & 0 & 0 & 0 & 0 & 0 & 0 & 0 & 0 & 0 & 0 & 0 & 0 & 0 \\ -0.259 & -0.243 & -0.28 & -0.212 & -0.102 & -0.086 & -0.070 & -0.055 & 0.055 & 0.070 & 0.086 & 0.102 & 0.212 & 0.229 & 0.243 & 0.259 \\ 0 & 0 & 0 & 0 & 0 & 0 & 0 & 0 & 0 & 0 & 0 & 0 & 0 & 0 & 0 & 0 \\ -0.012 & -0.016 & -0.020 & -0.024 & 0.048 & 0.052 & 0.056 & 0.060 & -0.060 & -0.056 & -0.052 & -0.048 & 0.024 & 0.020 & 0.016 & 0.012 \end{bmatrix}$$

$$\text{Im}(C) = \begin{bmatrix} 0 & 0 & 0 & 0 & 0 & 0 & 0 & 0 & 0 & 0 & 0 & 0 & 0 & 0 & 0 & 0 \\ -0.259 & -0.243 & -0.28 & -0.212 & -0.102 & -0.086 & -0.070 & -0.055 & 0.055 & 0.070 & 0.086 & 0.102 & 0.212 & 0.229 & 0.243 & 0.259 \\ 0 & 0 & 0 & 0 & 0 & 0 & 0 & 0 & 0 & 0 & 0 & 0 & 0 & 0 & 0 & 0 \\ -0.073 & -0.097 & -0.121 & -0.146 & 0.292 & 0.316 & 0.341 & 0.365 & -0.365 & -0.341 & -0.316 & -0.292 & 0.146 & 0.121 & 0.097 & 0.073 \end{bmatrix}$$

For clarity of explanation, the matrices of the real and imaginary parts of the codebook C are given separately. The above codebook matrix has 16 columns (representing codewords) and 4 rows (representing resources). Each column i=1, . . . , 16 represents an SCMA codeword $c_i$ occupying 4 resources. The binary label of each SCMA codeword is given in the following matrix.

$-0.259-0.259i$, 0, $-0.012-0.073i$). The 4 elements of the codewords are mapped into 4 resources. For example, a resource could be an OFDM subcarrier, a time slot, etc. In this way, the bits $b_0$, $b_1$ of the label vector of SCMA codewords may carry variable nodes of higher degrees. Thus, more power is allocated to higher degree variable $$\begin{bmatrix} \backslash & c_1 & c_2 & c_3 & c_4 & c_5 & c_6 & c_7 & c_8 & c_9 & c_{10} & c_{11} & c_{12} & c_{13} & c_{14} & c_{15} & c_{16} \\ b_0 & 0 & 0 & 0 & 0 & 0 & 0 & 0 & 0 & 1 & 1 & 1 & 1 & 1 & 1 & 1 & 1 \\ b_1 & 0 & 0 & 0 & 0 & 1 & 1 & 1 & 1 & 0 & 0 & 0 & 0 & 1 & 1 & 1 & 1 \\ b_2 & 0 & 0 & 1 & 1 & 0 & 0 & 1 & 1 & 0 & 0 & 1 & 1 & 0 & 0 & 1 & 1 \\ b_3 & 0 & 1 & 0 & 1 & 0 & 1 & 0 & 1 & 0 & 1 & 0 & 1 & 0 & 1 & 0 & 1 \end{bmatrix}$$

nodes. The UEP codebook may be optimized based on the variable node degree distribution of the LDPC code.

The above example embodiment uses natural labeling of codewords. In general, other labeling method may be used. For example, with a Gray labeling, the labeling matrix is shown below.

$$\begin{bmatrix} \backslash & c_1 & c_2 & c_3 & c_4 & c_5 & c_6 & c_7 & c_8 & c_9 & c_{10} & c_{11} & c_{12} & c_{13} & c_{14} & c_{15} & c_{16} \\ b_0 & 0 & 0 & 0 & 0 & 0 & 0 & 0 & 0 & 1 & 1 & 1 & 1 & 1 & 1 & 1 & 1 \\ b_1 & 0 & 0 & 0 & 0 & 1 & 1 & 1 & 1 & 1 & 1 & 1 & 1 & 0 & 0 & 0 & 0 \\ b_2 & 0 & 0 & 1 & 1 & 1 & 1 & 0 & 0 & 0 & 0 & 1 & 1 & 1 & 1 & 0 & 0 \\ b_3 & 0 & 1 & 1 & 0 & 0 & 1 & 1 & 0 & 0 & 1 & 1 & 0 & 0 & 1 & 1 & 0 \end{bmatrix}$$

In one example, two-dimensional UEP SCMA codebooks of 16 points of two protection levels for 6 users sharing 4 resources may be designed. Each codeword has a binary label vector of 4 bits ($b_0$, $b_1$, $b_2$, $b_3$). The factor matrix is shown below.

$$F = \begin{bmatrix} 0 & 1 & 1 & 0 & 1 & 0 \\ 1 & 0 & 1 & 0 & 0 & 1 \\ 0 & 1 & 0 & 1 & 0 & 1 \\ 1 & 0 & 0 & 1 & 1 & 0 \end{bmatrix}$$

Embodiment binary LDPC codes may be used as a channel code, chosen from 3GPP standard for 5G. An embodiment interleaver adopted in the 3GPP standard may be used between a channel encoder (e.g., LDPC encoder 902) and a SCMA codebook mapper (e.g., SCMA mapper 910). At the receiver, the message passing algorithm (MPA) for multi-user detection may perform 6 iterations. Unless otherwise stated, the LDPC decoder may perform 20 iterations using sum-product decoding. There are no outer iterations between the multi-user detector and the channel decoder.

Figure 10:
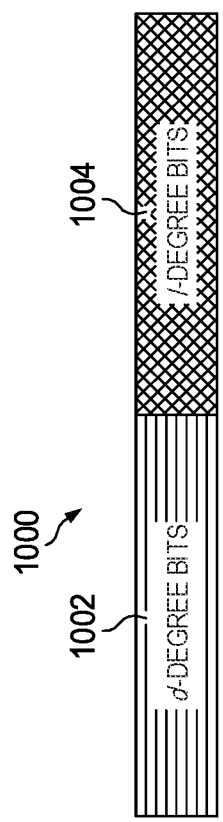
FIG. 10 shows a codeword form in the TS38.212 standard.

Binary LDPC codes that are adopted in the TS38.212 standard for 5G are irregular and systematic. The codeword has the form shown in FIG. 10. The bits constituting the LDPC codeword 1000 adopted in the standard are sorted within the codeword. Codeword 1000 includes $N_1$ bits 1002 connected to variable nodes of degrees higher than 1 (d>1) and $N_2$ bits 1004 connected to variable nodes of a degree of 1. Moreover, the variable nodes with the highest degrees are located at the beginning of the codeword 1000. $N=N_1+N_2$ may be the codeword length. The number $N_2$ of variable nodes of a degree of 1 depends on the code rate.

The input of the interleaver may be the LDPC codeword of length N: ($d_0$, $d_1$, $d_2$, ..., $d_{N-2}$, $d_{N-1}$). $M=2^m$ may be the SCMA codebook size (i.e., the number of codewords). The output of the interleaver is the bit sequence ($f_0$, $f_1$, $f_2$, ..., $f_{N-2}$, $f_{N-1}$) based on the following.

$$f_{i+j \cdot m} = d_{j+i \cdot \frac{N}{m}}, \; j = 0, \ldots, \frac{N}{m} - 1, \; i = 0, \ldots, m-1$$

Figure 11A:
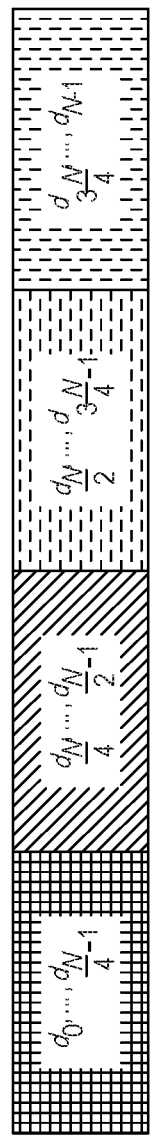
FIG. 11A shows an example codeword before interleaving.
Figure 11B:
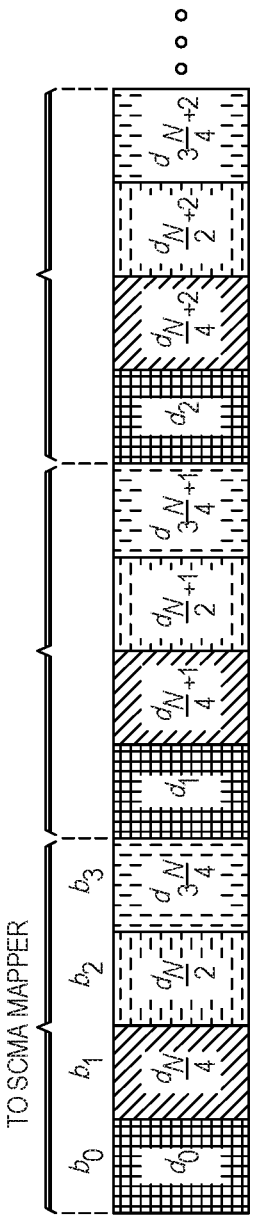
FIG. 11B shows an example bit sequence after interleaving.

When M=16 (m=4), the codeword before interleaving is shown in FIG. 11A. FIG. 11B shows the bit sequence after interleaving. Thus, the one-degree bits may be mapped to the last bits of the binary label vector of SCMA codewords. Consequently, the interleaver maps the variable nodes of higher degrees to the first bits of the binary label vector, whereas the variable nodes of lower degrees are mapped to last bits of the binary label vector. Hence, bits $b_0$, $b_1$ are assigned to the first protection level, and bits $b_2$, $b_3$ are assigned to the second protection level. The amplitude row vectors $A_u^\ell$ are optimized such that $a_n^{1,u} > a_n^{2,u}$ for each dimension $n \in \{1, \ldots, N\}$ and for each user u. In this way, more power are allocated to bits $b_0$, $b_1$, which improves the performance of iterative decoding since these bits are better connected than bits $b_2$, $b_3$.

For uplink single input single output (SISO) SUI-3 channel model with FFT of the size 256, a resource corresponds to an OFDM subcarrier. The average error rate performance of the UEP SCMA codebooks obtained using the above embodiment implementation method (where $A_u^\ell$ are optimized based on the LDPC code) are compared to the benchmark conventional SCMA codebooks ($A_u^\ell$ are fixed) for the uplink SUI-3 channel using FFT of size 256. The BER and FER are those of information bits only (parity bits not included). The vectors $A_u^\ell$ are optimized for target frame error rates between $10^{-1}$-$10^{-4}$.

Figure 12:
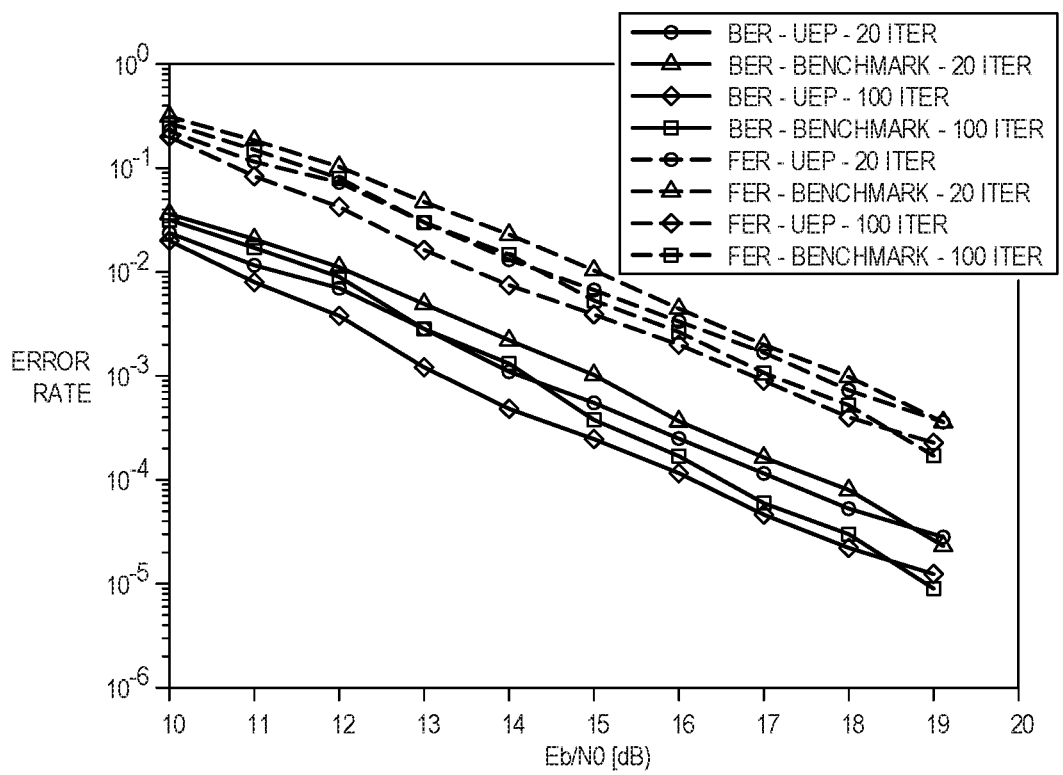
FIG. 12 shows the average error rate for 20 and 100 LDPC decoding iterations for a code rate ⅓ when the frame length is 132 bits.

FIG. 12 shows the average BER and FER curves for 20 and 100 LDPC decoding iterations. The frame length of the LDPC code is 132 bits, and the code rate is ⅓. UEP codebooks can achieve gains between 0.3 dB and 0.8 dB when $E_b/N_0 \leq 18$ dB independently on the number of decoding iterations. When $E_b/N_0 > 18$ dB, the optimal values of $A_u^\ell$ are those given by the benchmark codebooks.

Figure 13:
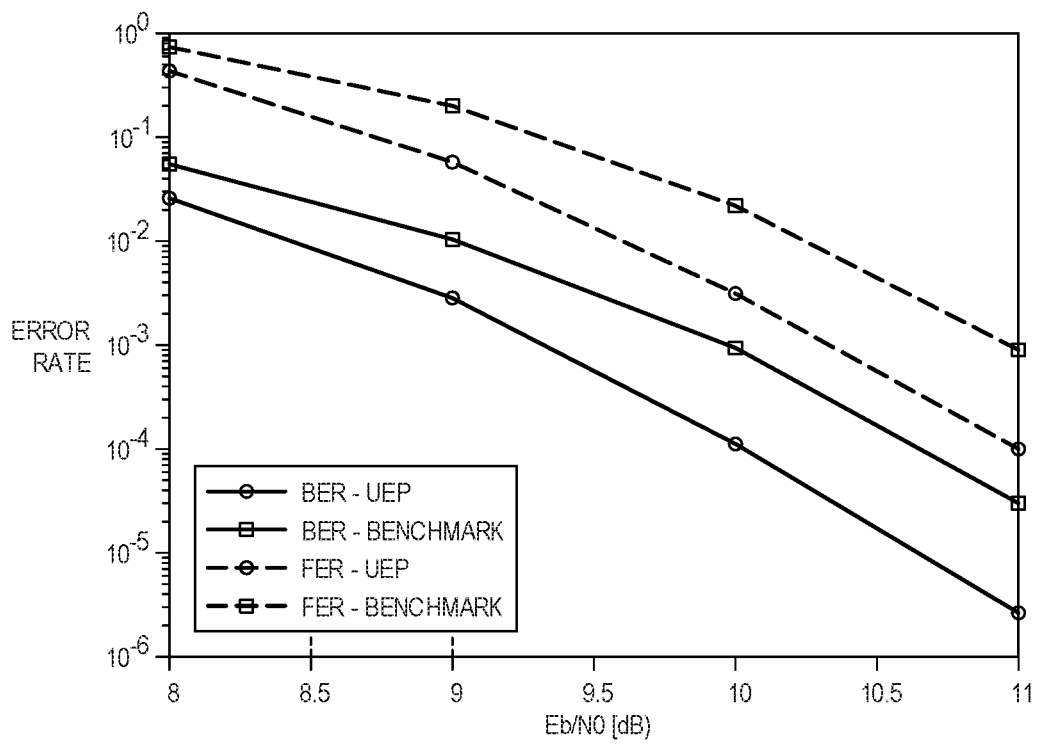
FIG. 13 shows the average error rate for 20 LDPC decoding iterations for a code rate ⅓ when the frame length is 1320 bits.

FIG. 13 shows the average BER and FER curves for 20 LDPC decoding iterations when the frame length is 1320 bits. The code rate is ⅓. A gain up to 0.65 dB can be achieved. The optimization of $A_u^\ell$ becomes more necessary for longer frame length.

Figure 14:
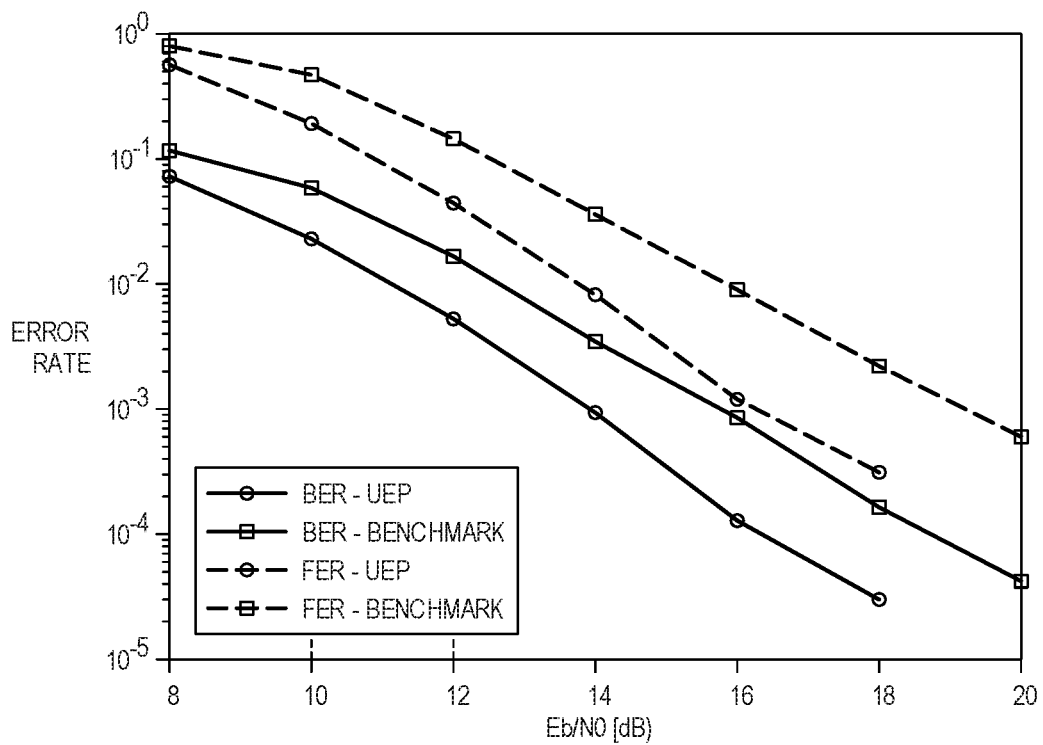
FIG. 14 shows the average error rate in the downlink Rayleigh fading channel for a code rate ⅓ when the frame length is 132 bits.
Figure 15:
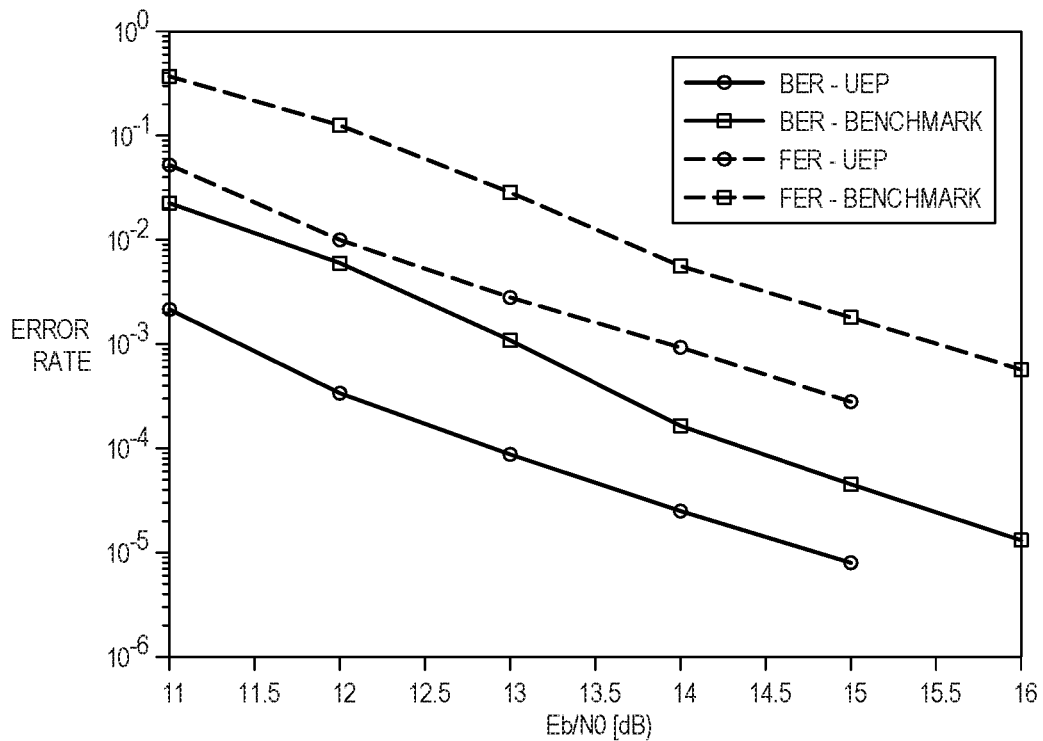
FIG. 15 shows the average error rate in the downlink Rayleigh fading channel for a code rate ⅖ when the frame length is 550 bits.
Figure 16:
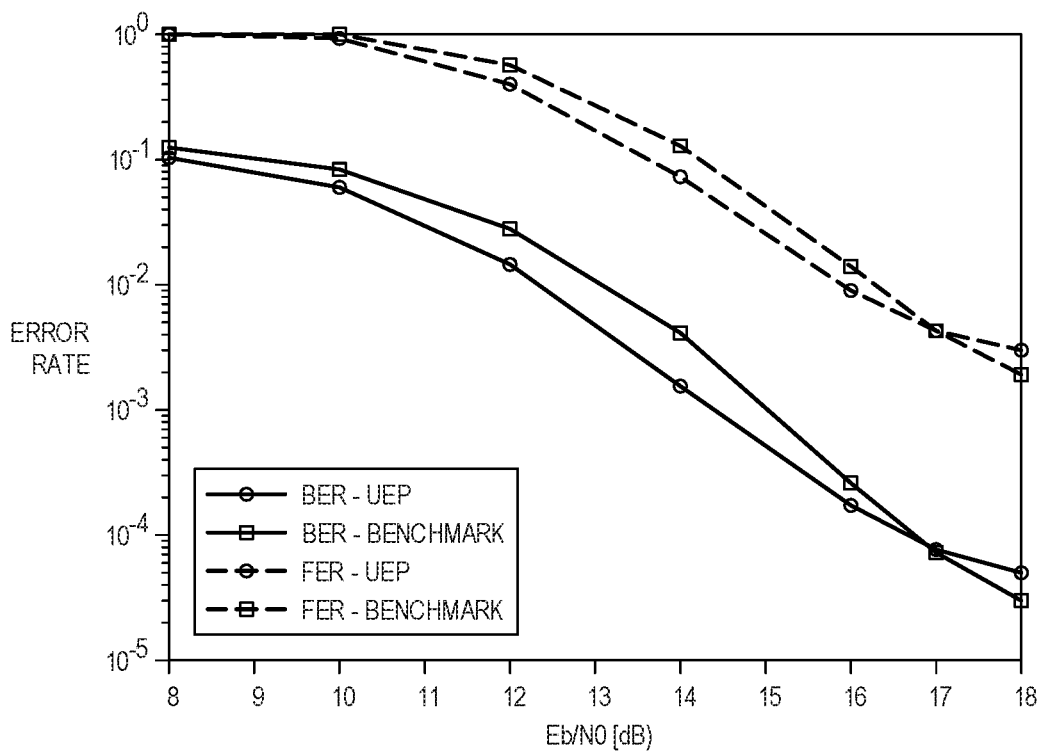
FIG. 16 shows the average error rate in the downlink Rayleigh fading channel for a code rate ½ when the frame length is 440 bits.

For downlink SISO Rayleigh fading channel, a resource corresponds to a time slot. The average error rate performance of the UEP SCMA codebooks obtained using the implementation method of the above embodiment (where $A_u^\ell$ are optimized based on the LDPC code) are compared to the benchmark conventional SCMA codebooks of ($A_u^\ell$ are fixed) for the downlink Rayleigh fading channel. The codebooks proposed in the above embodiment are more efficient in the downlink scenario. The gain obtained by optimizing the vectors $A_u$ increases when the code rate decreases for the LDPC codes. Hence, the codebook may be adapted to the code rate. Moreover, the minimum error rate, for which the $A_u^\ell$ given by the benchmark codebooks are not optimal, is lower for lower rates. FIG. 14 shows that, for a code rate ⅓ and a frame length 132 bits, up to 2.5 dB gain may be obtained for target frame error rates between $10^{-1}$-$10^{-4}$. FIG. 15 shows that, for a code rate ⅖ and a frame length 550 bits, up to 1.5 dB gain may be obtained for target frame error rates between $10^{-1}$-$10^{-4}$. FIG. 16 shows that, for a code rate ½ and a frame length 440 bits, up to 0.5 dB gain may be obtained for target frame error rates between $10^{-1}$-$4.10^{-3}$. The vectors $A_u^\ell$ given by the benchmark codes becomes optimal for target frame error rates lower than $4.10^{-3}$.

Table 1 below shows the peak-to-average power ratio (PAPR) of the optimized UEP SCMA codebooks. Lower PAPR is obtained with respect to the conventional benchmark codebook (1.23 dB).

TABLE 1

| Rate | PAPR [dB] |
|---|---|
| 1/3 | 0.2798 |
| 2/5 | 0.5921 |
| 1/2 | 1.0397 |

The above first embodiment uses a one-dimensional lattice of equally spaced complex symbols to build the mother constellation for each user. In a more general way, any one-dimensional lattice (e.g., star-QAM) may be used. The implementation method may also use the shuffling method to implement UEP SCMA codebooks. Moreover, the method may construct UEP SCMA codebooks to minimize the number of projection points in order to lower the complexity of multi-user detection.

The above first embodiment uses the rotation angles for each user in order to rotate the mother constellation. These angles have shown to give good performance in downlink Rayleigh channel. In general, the method may optimize these angles for each user based on the system model such as the channel model, and codebook parameters (e.g., the number of users, the dimension, and the size, etc.).

The method may construct the UEP codebooks for all users in order to optimize a certain performance criterion, such as error rate criteria (e.g., BER, FER, etc.) or information theoretic criteria (e.g., cut-off rate, mutual information, etc.) based on the channel model and the system model parameters (e.g., the number of users, the parameters of the error correcting code, etc.).

The above first embodiment illustrates how to construct UEP SCMA codebooks based on cloud partitioning described above. The above first embodiment also shows that UEP codebooks could improve the error rate performance. A method based on constellation rotation and interleaving described herein allows construction of UEP codebooks of arbitrary size and dimensions in a simple manner. Moreover, the amplitude row vectors $A_u^\ell$ in this method provide a degree of freedom to adjust the levels of protections based on the existing error-correction code.

Figure 17:
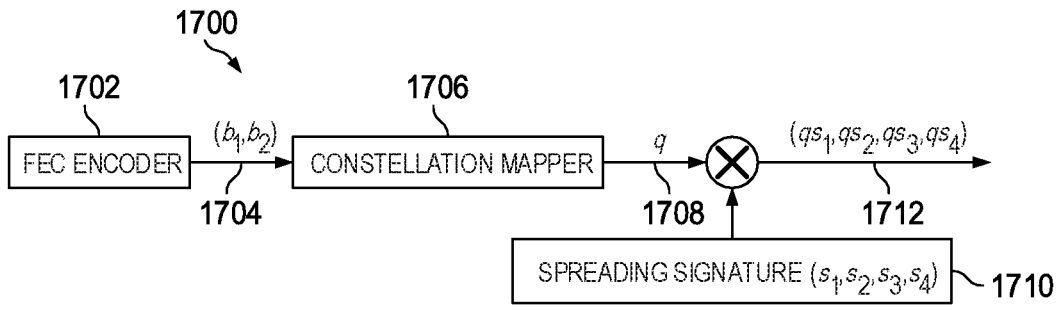
FIG. 17 shows an example LDS system with a constellation mapper, according to some embodiments.

In a second embodiment, LDS is used as a multiple access scheme. FIG. 17 shows a LDS system 1700 with a constellation mapper 1706, according to the second embodiment. The LDS mapper is a special case of the SCMA code where the constellation points are repeated over non-zero resources. In LDS, FEC encoder 1702 generates coded bits 1704. The constellation mapper 1706 maps coded bits 1704 into constellation symbols 1708. Then, each constellation symbol 1708 is spread over multiple resources using a spreading sequence 1712 based on spreading signatures 1710. The implementation method may construct the constellation using cloud partitioning method. A practical method to implement a QAM constellation with L protection levels is to superpose L QAM constellation with different average powers, and the average powers may be optimized based on the existing error correction code.

For example, to construct an UEP constellation of 16 points $X_{16QAM}$ and two protection levels. $X_{16QAM}$, the implementation method may superpose two QAM of 4 symbols (4-QAM): $X_{16QAM} = \sqrt{P_1} X_{4QAM} \boxplus \sqrt{P_2} X_{4QAM}$, where $\boxplus$ denotes constellation superposition and $X_{4QAM}$ is a 4-QAM of the average power P. The resulting constellation may look like the constellation in FIG. 6. The power ratio $\frac{P_1}{P_2}$ is optimized based on the existing error correction code. A bit-level operator (e.g., an interleaver) may be employed between the FEC encoder 1702 and the constellation mapper 1706.

The above second embodiment discloses a practical method to construct UEP constellations for LDS using constellation superposition. The average power of each constellation involved in the superposition is optimized based on the existing error correction code.

In a third embodiment, the cloud partitioning method may be applied in the power domain NoMA. In the power domain NoMA, users are distinguished by the users' transmitting average powers. Under an average power constraint $P_i$ for each user i, the implementation method may construct a UEP constellation for each user using the cloud partitioning method. As in the LDS scheme in the second embodiment, a practical method to implement a QAM constellation with L protection levels and average power $P_i$ is to superpose L QAM constellations with different average power $P_{\ell i}, \ldots, \ell = 1, \ldots, L$. Average powers $P_{\ell i}$ may be optimized based on the existing error correction code.

Figure 18:
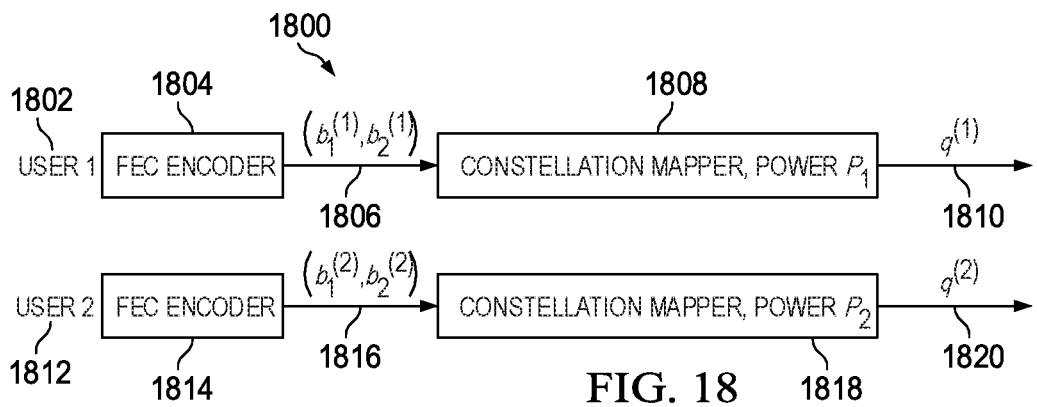
FIG. 18 shows an example power-domain NoMA system with no spreading, according to some embodiments.

FIG. 18 shows a power-domain NoMA system 1800 with no spreading. For user 1802, FEC encoder 1804 generates coded bits 1806. Then, constellation mapper 1808 (with power $P_1$) maps coded bits 1806 into constellation symbols 1810. For user 1812, FEC encoder 1814 generates coded bits 1816. Then, constellation mapper 1818 (with power $P_2$) maps coded bits 1816 into constellation symbols 1820. A bit-level operator (e.g., an interleaver) could be employed between the FEC encoder and the constellation mapper.

The above third embodiment discloses a practical method to construct UEP constellations for PD-NoMA using constellation superposition. The average power of each constellation involved in the superposition is optimized based on the existing error correction code.

FIG. 19A illustrates a flowchart of method 1900 for data communications by a device in a communications system, according to some embodiments. Method 1900 may be carried out or performed by a transmitter of a communications device, such as the transmitter 200 in FIG. 2. Method 1900 may also be carried out or performed by routines, subroutines, or modules of software executed by one or more processors of the communications device. Coding of the software for carrying out or performing method 1900 is well within the scope of a person of ordinary skill in the art having regard to the present disclosure. The method may include additional or fewer operations than those shown and described and may be carried out or performed in a different order. Computer-readable code or instructions of the software executable by the one or more processor of the communications device may be stored on a non-transitory computer-readable medium, such as for example, memory of the communications device.

Method 1900 begins at operation 1902, where a bit-to-symbol mapper of the transmitter may obtain a forward error correction (FEC) encoded bit stream. The FEC encoded bit stream may be generated by an FEC encoder that encodes the payload data, such as FEC encoder 210. In one embodiment, the bit-to-symbol mapper may obtain the FEC encoded bit stream from an interleaver between the FEC encoder and the bit-to-symbol mapper. The FEC encoded bit stream may comprise a first FEC bit position associated with a first FEC error protection level and a second FEC bit position associated with a second FEC error protection level. The first FEC error protection level may be greater than the second FEC error protection level.

At operation 1904, the bit-to-symbol mapper may map the FEC encoded bit stream to produce a set of symbols according to a bit-to-symbol mapping rule. The bit-to-symbol mapping rule may comprise a first mapper bit position associated with a first mapper error protection level and a second mapper bit position associated with a second mapper error protection level. The first mapper error protection level may be greater than the second mapper error protection level. In one embodiment, the first FEC bit position may be mapped to the first mapper bit position, and the second FEC bit position may be mapped to the second mapper bit position. In another embodiment, the first FEC bit position may be mapped to the second mapper bit position, and the second FEC bit position may be mapped to the first mapper bit position.

In one embodiment, the FEC encoded bit stream may be a low-density parity-check (LDPC) encoded bit stream. The first FEC bit position may be associated with a first variable node of a LDPC code, and the second FEC bit position may be associated with a second variable node of the LDPC code. A degree of the first variable node may be higher than a degree of the second variable node. The LDPC encoded bit stream may be an interleaved LDPC encoded bit stream comprising a plurality of bits having the first FEC error protection level interleaved with a plurality of bits having the second FEC error protection level.

The first mapper error protection level may correspond to a first minimum distance, and the second mapper error protection level may correspond to a second minimum distance. The first minimum distance may be greater than the second minimum distance. The bit-to-symbol mapping rule may define a first subset of symbols separated by at least the first minimum distance from a second subset of symbols. The symbols in the first subset may be each separated by at least the second minimum distance, and the symbols in the second subset may be each separated by at least the second minimum distance.

In one embodiment, the bit-to-symbol mapping rule may be a one-dimensional constellation for mapping bits to complex-valued constellation points. The bit-to-symbol mapper may further spread the complex-valued constellation points to physical time and frequency resources. In another embodiment, the bit-to-symbol mapping rule may be a codebook for mapping and spreading bits to multi-dimensional codewords.

The bit-to-symbol mapping rule may be constructed by superposing a number of quadrature amplitude modulation (QAM) constellations with corresponding average powers associated with corresponding mapper error protection levels. The number of QAM constellations equal a number of the corresponding mapper error protection levels.

At operation 1906, the transmitter of the communications device may transmit the set of symbols in the communications system.

FIG. 19B illustrates a flowchart of method 1950 for data communications by a receiving device in a communications system, according to some embodiments. Method 1950 may be carried out or performed by a receiver of a communications device. Method 1950 may also be carried out or performed by routines, subroutines, or modules of software executed by one or more processors of the communications device. Coding of the software for carrying out or performing method 1950 is well within the scope of a person of ordinary skill in the art having regard to the present disclosure. The method may include additional or fewer operations than those shown and described and may be carried out or performed in a different order. Computer-readable code or instructions of the software executable by the one or more processor of the communications device may be stored on a non-transitory computer-readable medium, such as for example, memory of the communications device.

At operation 1952 of method 1950, the receiver of the communications device may receive a set of symbols from the communications system. The set of symbols may be mapped from a forward error correction (FEC) encoded bit stream according to a bit-to-symbol mapping rule. The bit-to-symbol mapping rule may comprise a first mapper bit position associated with a first mapper error protection level and a second mapper bit position associated with a second mapper error protection level. The FEC encoded bit stream may comprise a first FEC bit position associated with a first FEC error protection level and a second FEC bit position associated with a second FEC error protection level. The first FEC error protection level may be greater than the second FEC error protection level.

The above embodiments describe NoMA transmitter and receiver implementations based on designs of unequal error protection codebooks or constellations with flexible degrees of protection levels. The protection levels of the embodiment UEP codebooks or constellations can be optimized based on the existing error correction code and the system model parameters (e.g., the channel model, the number of users sharing same resources, etc.). This disclosure describes the above embodiments with respect to NoMA systems. Techniques described above may also apply to wireless communications systems in general, including orthogonal multiple access (OMA) systems and non-MA systems.

FIG. 20 illustrates a block diagram of an embodiment processing system 2000 for performing methods described herein. As shown, the processing system 2000 includes a processor 2004, a memory 2006, and interfaces 2010-2014. The processor 2004 may be any component or collection of components adapted to perform computations and/or other processing related tasks, and the memory 2006 may be any component or collection of components adapted to store programming and/or instructions for execution by the processor 2004. In an embodiment, the memory 2006 includes a non-transitory computer readable medium. The interfaces 2010, 2012, 2014 may be any component or collection of components that allow the processing system 2000 to communicate with other devices/components and/or a user. For example, one or more of the interfaces 2010, 2012, 2014 may be adapted to communicate data, control messages, or management messages from the processor 2004 to applications installed on a host device and/or a remote device. As another example, one or more of the interfaces 2010, 2012, 2014 may be adapted to allow a user-side device (e.g., personal computer (PC), etc.) to interact/communicate with the processing system 2000. The processing system 2000 may include additional components not depicted in FIG. 20, such as long term storage (e.g., non-volatile memory, etc.).

In some embodiments, the processing system 2000 is included in a network device that is accessing, or part otherwise of, a telecommunications network. In one example, the processing system 2000 is in a network-side device in a wireless or wireline telecommunications network, such as a base station, a relay station, a scheduler, a controller, a gateway, a router, an applications server, or any other device in the telecommunications network. In other embodiments, the processing system 2000 is in a user-side device accessing a wireless or wireline telecommunications network, such as a mobile station, a user equipment (UE), a personal computer (PC), a tablet, a wearable communications device (e.g., a smartwatch, etc.), or any other device adapted to access a telecommunications network.

In some embodiments, one or more of the interfaces 2010, 2012, 2014 connects the processing system 2000 to a transceiver adapted to transmit and receive signaling over the telecommunications network. FIG. 21 illustrates a block diagram of a transceiver 2100 adapted to transmit and receive signaling over a telecommunications network. The transceiver 2100 may be installed in a host device. As shown, the transceiver 2100 comprises a network-side interface 2102, a coupler 2104, a transmitter 2106 (which may be implemented using all or some components of the transmitter 200 in FIG. 2), a receiver 2108, a signal processor 2110, and a device-side interface 2112. The network-side interface 2102 may include any component or collection of components adapted to transmit or receive signaling over a wireless or wireline telecommunications network. The network-side interface 2102 may also include any component or collection of components adapted to transmit or receive signaling over a short-range interface. The network-side interface 2102 may also include any component or collection of components adapted to transmit or receive signaling over a Uu interface. The coupler 2104 may include any component or collection of components adapted to facilitate bi-directional communications over the network-side interface 2102. The transmitter 2106 may include any component or collection of components (e.g., up-converter, power amplifier, etc.) adapted to convert a baseband signal into a modulated carrier signal suitable for transmission over the network-side interface 2102. A means for transmitting an initial message of an access procedure may include transmitter 2106. The receiver 2108 may include any component or collection of components (e.g., down-converter, low noise amplifier, etc.) adapted to convert a carrier signal received over the network-side interface 2102 into a baseband signal. A means for receiving mobile subscriber identifiers, initial downlink messages of access procedures, and forwarded requests to connect to a network may include receiver 2108.

The signal processor 2110 may include any component or collection of components adapted to convert a baseband signal into a data signal suitable for communications over the device-side interface(s) 2112, or vice-versa. The device-side interface(s) 2112 may include any component or collection of components adapted to communicate data-signals between the signal processor 2110 and components within the host device (e.g., the processing system 2000, local area network (LAN) ports, etc.).

The transceiver 2100 may transmit and receive signaling over any type of communications medium. In some embodiments, the transceiver 2100 transmits and receives signaling over a wireless medium. For example, the transceiver 2100 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communications (NFC), etc.).

In such embodiments, the network-side interface 2102 comprises one or more antenna/radiating elements. For example, the network-side interface 2102 may include a single antenna, multiple separate antennas, or a multi-antenna array configured for multi-layer communications, e.g., single input multiple output (SIMO), multiple input single output (MISO), multiple input multiple output (MIMO), etc. In other embodiments, the transceiver 2100 transmits and receives signaling over a wireline medium, e.g., twisted-pair cable, coaxial cable, optical fiber, etc. Specific processing systems and/or transceivers may utilize all of the components shown, or only a subset of the components, and levels of integration may vary from device to device.

Although this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
    obtaining, by a device, a forward error correction (FEC) encoded bit stream;
    mapping, by the device, the FEC encoded bit stream to a set of symbols according to a bit-to-symbol mapping rule, wherein the bit-to-symbol mapping rule comprises a first mapper bit position associated with a first mapper error protection level and a second mapper bit position associated with a second mapper error protection level, wherein the first mapper error protection level is greater than the second mapper error protection level, wherein the first mapper error protection level corresponds to a first minimum distance, and wherein the second mapper error protection level corresponds to a second minimum distance, the first minimum distance being greater than the second minimum distance; and
    transmitting, by the device, the set of symbols.

2. The method of claim 1, wherein the FEC encoded bit stream comprises a first FEC bit position associated with a first FEC error protection level and a second FEC bit position associated with a second FEC error protection level, wherein the first FEC error protection level is greater than the second FEC error protection level.

3. The method of claim 2, wherein the first FEC bit position is mapped to the first mapper bit position, and the second FEC bit position is mapped to the second mapper bit position.

4. The method of claim 2, wherein the first FEC bit position is mapped to the second mapper bit position, and the second FEC bit position is mapped to the first mapper bit position.

5. The method of claim 2, wherein the FEC encoded bit stream is a low-density parity-check (LDPC) encoded bit stream, the first FEC bit position is associated with a first variable node of a LDPC code, the second FEC bit position is associated with a second variable node of the LDPC code, and a first degree of the first variable node is higher than a second degree of the second variable node.

6. The method of claim 5, wherein the LDPC encoded bit stream is an interleaved LDPC encoded bit stream comprising a first plurality of bits having the first FEC error protection level interleaved with a second plurality of bits having the second FEC error protection level.

7. The method of claim 1, wherein the bit-to-symbol mapping rule defines a first subset of symbols separated by at least the first minimum distance from a second subset of symbols, and wherein the symbols in the first subset are each separated by at least the second minimum distance and the symbols in the second subset are each separated by at least the second minimum distance.

8. The method of claim 1, wherein the bit-to-symbol mapping rule is a one-dimensional constellation for mapping bits to complex-valued constellation points.

9. The method of claim 8, further comprising spreading the complex-valued constellation points to physical time and frequency resources.

10. The method of claim 1, wherein the bit-to-symbol mapping rule is a codebook for mapping and spreading bits to multi-dimensional codewords.

11. The method of claim 1, wherein the bit-to-symbol mapping rule is constructed by superposing a number of quadrature amplitude modulation (QAM) constellations with corresponding average powers associated with corresponding mapper error protection levels, and the number of QAM constellations equal a number of the corresponding mapper error protection levels.

12. A transmitting device comprising:
a bit-to-symbol mapper configured to:
obtain a forward error correction (FEC) encoded bit stream; and
map the FEC encoded bit stream to a set of symbols according to a bit-to-symbol mapping rule, wherein the bit-to-symbol mapping rule comprises a first mapper bit position associated with a first mapper error protection level and a second mapper bit position associated with a second mapper error protection level, wherein the first mapper error protection level is greater than the second mapper error protection level, wherein the first mapper error protection level corresponds to a first minimum distance, and wherein the second mapper error protection level corresponds to a second minimum distance, the first minimum distance being greater than the second minimum distance; and
a transmitter configured to:
transmit the set of symbols.

13. The transmitting device of claim 12, wherein the FEC encoded bit stream comprises a first FEC bit position associated with a first FEC error protection level and a second FEC bit position associated with a second FEC error protection level, wherein the first FEC error protection level is greater than the second FEC error protection level.

14. The transmitting device of claim 13, wherein the first FEC bit position is mapped to the first mapper bit position, and the second FEC bit position is mapped to the second mapper bit position.

15. The transmitting device of claim 13, wherein the first FEC bit position is mapped to the second mapper bit position, and the second FEC bit position is mapped to the first mapper bit position.

16. The transmitting device of claim 13, wherein the FEC encoded bit stream is a low-density parity-check (LDPC) encoded bit stream, the first FEC bit position is associated with a first variable node of a LDPC code, the second FEC bit position is associated with a second variable node of the LDPC code, and a first degree of the first variable node is higher than a second degree of the second variable node.

17. The transmitting device of claim 16, wherein the LDPC encoded bit stream is an interleaved LDPC encoded bit stream comprising a first plurality of bits having the first FEC error protection level interleaved with a second plurality of bits having the second FEC error protection level.

18. A device comprising:
at least one processor;
a non-transitory memory storing instructions that are executable by the at least one processor to cause the device to:
obtain a forward error correction (FEC) encoded bit stream;
map the FEC encoded bit stream to a set of symbols according to a bit-to-symbol mapping rule, wherein the bit-to-symbol mapping rule comprises a first mapper bit position associated with a first mapper error protection level and a second mapper bit position associated with a second mapper error protection level, wherein the first mapper error protection level is greater than the second mapper error protection level, wherein the first mapper error protection level corresponds to a first minimum distance, and wherein the second mapper error protection level corresponds to a second minimum distance, the first minimum distance being greater than the second minimum distance; and
transmit the set of symbols.

19. The device of claim 18, wherein the FEC encoded bit stream comprises a first FEC bit position associated with a first FEC error protection level and a second FEC bit position associated with a second FEC error protection level, wherein the first FEC error protection level is greater than the second FEC error protection level.

* * * * *